United States Patent [19]

Lee

[11] Patent Number: 4,488,063
[45] Date of Patent: Dec. 11, 1984

[54] EFL LATCH MERGED WITH DECODER-MULTIPLEXER

[75] Inventor: Shi-Chuan Lee, San Diego, Calif.

[73] Assignee: Burroughs Corporation, Detroit, Mich.

[21] Appl. No.: 310,381

[22] Filed: Oct. 13, 1981

Related U.S. Application Data

[63] Continuation of Ser. No. 095,154, Nov. 19, 1979, abandoned.

[51] Int. Cl.³ .................. H03K 3/286; H03K 19/082
[52] U.S. Cl. .................. 307/289; 307/299 A; 307/455; 307/463; 365/154
[58] Field of Search ............ 307/291, 299 A, 317 A, 307/289, 455, 463, 465, 467; 365/154, 155, 205

[56] References Cited

U.S. PATENT DOCUMENTS 3,795,822 3/1974 Skokan .................. 307/455
4,145,623 3/1979 Doucette .................. 307/467

OTHER PUBLICATIONS

R. I. Spadavecchia et al., "Low-Power Current Switch Circuitry with Higher Power External Drive Circuitry" IBM TDB vol. 14, No. 12, May 1972, pp. 3688-3689.

A. W. Chang et al., "True-Complement Generator" IBM Technical Disclosure Bulletin, vol. 15, No. 4, Sep. 1972, pp. 1098-1099.

Primary Examiner—John Zazworsky
Attorney, Agent, or Firm—Charles J. Fassbender; Joseph R. Dwyer; Kevin R. Peterson

[57] ABSTRACT

A CML compatible EFL type latch with a data input transistor differentially coupled as a current switch to one emitter of a second multi-emitter transistor. The second emitter of the second transistor is differentially coupled as a current switch to a third transistor. The true output of the latch is connected to the collector of the second transistor, and to the base of the third transistor. Second, clamping Schottky barrier disposed between the collector and base of the third transistor. A third current switch responsive to a system clock source is connected between the two current switches to complete the latch circuitry. Utilizing this arrangement, the EFL type latch is connected directly to a combination decoder-multiplexer circuit.

8 Claims, 2 Drawing Figures

$N = 2^M$

EFL LATCH MERGED WITH DECODER-MULTIPLEXER

This is a continuation of application Ser. No. 095,154 filed Nov. 19, 1979, now abandoned.

BACKGROUND OF THE INVENTION

1. Field of Invention

This invention relates to logic gates (switching circuits) for high speed digital systems.

2. Prior Art

A class of logic circuit configurations of a non-inverting type known as Emitter Function Logic (EFL), providing performance of most of the logic operations at the emitter of a multi-emitter bipolar transistor, are described in the U.S. Pat. No. 3,795,822 to Z. E. Skokan dated Mar. 5, 1974 and entitled, "Multi-Emitter Coupled Logic Gate". These gates are also described in a paper entitled, "Emitter Function Logic-Family for LSI", by the inventor named in the foregoing patent and published in the *IEEE Journal of Solid State Circuits*, pages 356–361, October 1973.

The modification of the EFL type circuits to maintain the advantage of Current Mode Logic (CML) and to add to the family of logic functions by providing a complement output, not available in the EFL gate of Skokan, is described in the U.S. Pat. No. 4,145,623 entitled, "Current Mode Logic Compatible Emitter Function Type Logic Family", dated Mar. 20, 1979, by R. L. Doucette.

Reference is particularly made to prior art FIG. 1 of the Doucette patent which shows the true output Q taken off one of the emitters of a multi-emitter output transister of the typical EFL type gate and prior art FIG. 2 of the patent which shows the gate modified to change the voltage level of the Q output so that a standard CML gate may be connected thereto. The latter generated a complement output useful for logic systems and described as prior art in the Doucette patent.

In the application of data storage register files (an application different from the applications involved in the Doucette patent), the latch of FIG. 2 of the Doucette patent is typically connected to a separate multiplexer which in turn is connected to a separate decoder for addressing the register. This is shown in FIG. 1 herein where the latch 10 has its Q output connected to a multiplexer 12. This Figure also shows a plurality of latches, 10-10$^N$, are also connected to the multiplexers 12-12$^N$ and to decoders A and B in a typical prior art system.

Because of the requirement for the separate multiplexers in the prior art which requires a gate for each input Q-Q$^N$ because there is a time delay caused by the interposition of the separate multiplexers between the latches and the separate decoders, and because the separate multiplexers and decoders also require a current source, it is apparent that the elimination of such requirements will improve the speed, performance and power dissipation, and it is to these results that the invention is directed.

It is therefore an object of this invention to provide a new and improved EFL type latch which is merged with a combination decoder-multiplexer circuit to thus improve speed, performance, and reduce power dissipation in CML circuitry.

SUMMARY OF THE INVENTION

The circuit which overcomes the aforementioned deficiencies in the prior art comprises a CML compatible EFL type latch with a data input transistor differentially coupled as a current switch to one emitter of a second multi-emitter transistor. The second emitter of the second transistor is differentially coupled as a current switch to a third transistor. The true output of the latch is connected to the collector of the second transistor, base of the third transistor. A resistor and a clamping Schottky barrier diode is disposed between the collector and base of the third transistor. A third current switch responsive to a system clock source is connected between the two current switches to complete the latch circuitry and utilizing this arrangement, the EFL type output can be connected directly to the combination decoder-multiplexer circuit.

DETAILED DESCRIPTION OF THE INVENTION

Again, the invention disclosed and claimed herein can be better understood by reference first to the CML compatible EFL latch as previously described above, and then to the modification of such a latch to form this invention.

Figure 1:
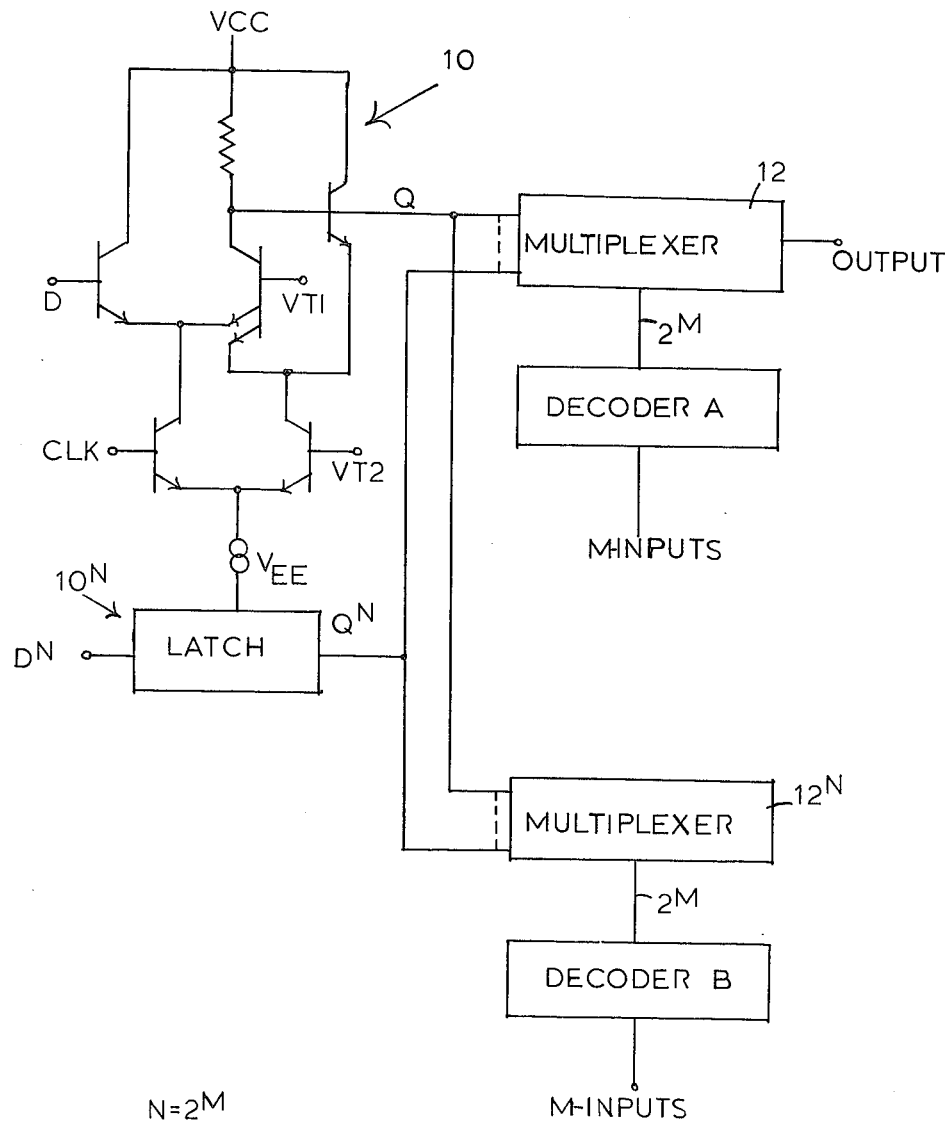
FIG. 1, already described, is a schematic drawing of the prior art EFL type logic gate latches coupled to separate multiplexers and decoders for addressing a register file.
Figure 2:
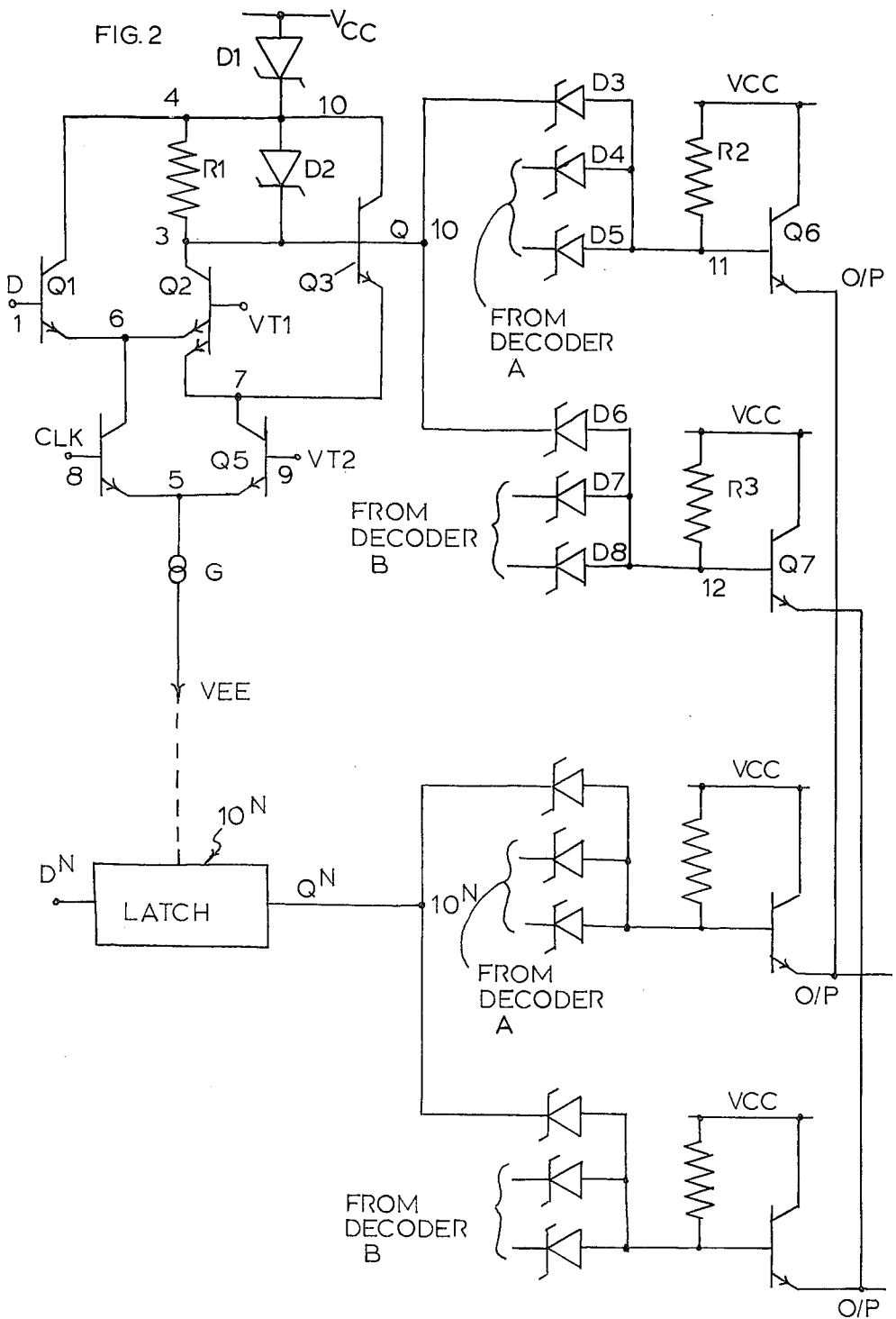
FIG. 2 is a schematic diagram of a CML compatible EFL gate latch with its true output connected directly to two different combination decoder-multiplexer circuits.

Turning now to FIG. 2, it can be seen that there is shown a gated latch 10 (one of several such latches 10-10$^N$) of the EFL type operated by a single phase type clock.

The gated latch 10 has a first current switch comprising a pair of NPN transistors (or gain elements) Q1 and Q2. Transistor Q2 is a double emitter type transistor with one emitter differentially connected to the single emitter of transistor Q1 and its second emitter differentially connected to an NPN output transistor (gain element) Q3 to form a second current switch. Input node 1 is connected to the base of transistor Q1 to form the input stage and to receive binary data input signals D which are HIGH or LOW relative to a selected threshold voltage level applied to the base of transistor Q2 at node 2 from a voltage threshold source VT1, (typically −0.8 V). The output Q is connected to the collector of transistor Q2 at node 3 and to the base of transistor Q3 so that the voltage level of output Q is CML compatible and the collectors of transistors Q1 and Q3 are connected at node 4 directly to the cathode of a Schottky barrier diode D1 which has its anode, in turn, connected to a positive voltage source VCC, (typically 0.0 V or ground). The collector of transistor Q2 is also connected to node 4 but through a resistor R1 located between nodes 3 and 4. Diode D1 provides a voltage offset between VCC and the collector of transistors Q1–Q3. Also connected in parallel with resistor R1, between nodes 3 and 4, is a second Schottky barrier diode D2. This diode, in series with diode D1, is also connected to the base of transistor Q3 to function as a clamp.

A third current switch comprising differentially connected pairs of single emitter NPN transistors (gain elements) Q4 and Q5 have their emitters connected in common at node 5 through a constant current generator G to a negative supply voltage VEE (typically −4.8 V) and their collectors connected, respectively, at node 6, between the emitters of transistors Q1 and Q2 and, at node 7, between the emitters of transistors Q2 and Q3. The current switch Q4 and Q5 is connected to a single phase type clock with the source CLK being shown connected at node 8 to the base of transistor Q4 while the base of transistor Q5 is connected at node 9 to a second threshold voltage source VT2. Clock LOW and HIGH states are relative to the threshold voltage (typically −1.6 V) applied to the base of transistor Q5.

To complete the description of the circuit, it can be seen that the true output Q is connected at output node 10 to a decoder multiplexer logic element through a third Schottky barrier diode D3. The subsequent logic element is identified as an NPN transistor Q6 with its collector connected to VCC and with its base connected at node 11 to VCC through resistor R2 to Schottky barrier diode D3 and to two parallely connected Schottky barrier diodes D4 and D5 from a source A, (not shown) since they form no part of this invention; suffice to say however, that the sources are connected through CML gates to diodes D4 and D5.

The output node 10 is also connected to similarly arranged circuitry including Schottky barrier diodes D6 and D7, D8 which form inputs from a source B to NPN transistor Q7 and resistor R3. It is to be understood that while only two such logic elements are shown, the output node 10 could be connected to any number of logic elements.

In the operation of latch 10, taking the clock HIGH situation first, i.e., the voltage of the clock signal CLK 8 is HIGH compared to the voltage at node 9, then current flows through transistor Q4 and node 6 where current flow depends whether the data at input D at node 1 is HIGH or LOW compared to the threshold voltage VT1 at node 2.

If the voltage at node 1 is HIGH, then current will flow through transistor Q1 making the voltage at node 4 about −600 mV; the voltage drop across the diode D1. The voltage at node 4 of −600 mV is reflected at node 3 as −600 mV which is a HIGH.

On the other hand, if the voltage at node 1 is LOW compared to node 2, then current will flow through node 6, transistor Q2 to nodes 3 and 4. Voltage at node 3 will then drop to about −1.0 V which is a LOW. [−1.0 V= voltage drop of −600 mV across diode D1+(−400 mV across resistor R1)].

Consider now the clock LOW situation which is the latch mode operation, i.e., the voltage applied by the clock CLK is LOW at node 8, compared to the voltage VT2 at node 9.

If the output Q is HIGH before the clock makes a transition from HIGH to LOW, then node 3 is also a HIGH (−600 mV). In this case the voltage at node 3 would be compared to the voltage at node 2 which is normally at −800 mV. Since −600 mV at node 3 is higher than the −800 mV at node 2, the current when the clock signal voltage goes below the voltage on node 9, will flow through transistor Q5, node 7, Q3, node 4 and VCC. Node 3 would then maintain its HIGH level of −600 mV. If the voltage at node 3 is LOW (−1.0 V) before the clock transition from HIGH to LOW, then node 3, at −1.0 V, is lower than node 2 which is at −800 mV, and current, when the clock signal voltage goes below the voltage at node 9, will then flow through transistor 05, node 7, transistor Q2, node 3, node 4 and VCC. Therefore, node 3 will maintain at a −1.0 volt. The latch mode operation, therefore, maintains node 3, and therefore output Q, at a HIGH or LOW depending on the status of node 3 before the transition of the clock signal for HIGH to LOW at node 8.

To transfer data out of the latch, two conditions exist, one where a latch output is selected and one where a latch output is not selected.

If a latch output is selected, the voltage at both diodes D4 and D5 (or diodes D7 and D8, as the case may be,) are at VCC (0.0 V). Thus, diodes D4 and D5 (or D7 and D8) will be reversed biased since VCC is also ground. Therefore, no current will flow through any of the diodes D4, D5, D7 or D8. In this case, if node 3 is HIGH (−600 mV), then node 11 will be almost at VCC, or ground, due to the voltage drop across diode D3 of about 600 mV. Thus, 0.0 V at node 11 is a HIGH. Node 12 is also at a HIGH state due to the voltage drop across diode D6. If node 3 is LOW (−1.0 V), then the voltage drop across the diodes D3 and D6 makes nodes 11 and 12 approximately −400 mV, which is a LOW. Thus, when a latch output is selected, the base of transistors Q6 and Q7 will reflect the HIGHS and LOWS at node 3.

If a latch output is not selected, then the input to either diode D4 or D5, or either D7 or D8, will drop to −1.0 V which will then make the voltage at nodes 11 and 12 at −400 mV because the voltage drop across the selected diode is again about 600 mV. Therefore, nodes 11 or 12, as the case may be, will remain at −400 mV regardless of the voltage on node 3.

So essentially, if one of the signals from source A or B is LOW, node 11 or 12 is also LOW as the case may be.

Finally, to explain the function of the clamping diode D2, assume that the latch is in the latch mode and assuming that the voltage at node 3 is also LOW, if the latch outputs are selected then the current from node 5 has three current components. One is from node 4 to node 3 and the other two paths are from node 11 to node 3, to node 7 and node 12 to node 3 and to node 7. Therefore, with current divided into three parts, the current flowing through node 4 to node 3 is reduced. The resistor R1 between node 3 and 4 must have a minumum valve such that under this condition it will produce a 400 mV voltage drop.

However, if the latch output is not selected, i.e., one of the inputs to diode D4 and D5 or D7 and D8, is at a −1.0 V, then there is current through the resistor R2 between VCC and node 11 so that the current going from VCC to node 11 and to D4 and D5, or VCC to node 12 and to D7 and D8 and the current flowing from node 11 to node 3 and node 12 to node 3 will be reduced. Therefore, current flowing through node 4 to mode 3 will be increased and the resultant voltage drop across the resistor R1 is more than 400 mV. To avoid this situation, diode D2 is used to clamp the base-collector junction of transistor Q3.

From the foregoing, it can be seen that speed has been increased by the elimination of the separate multiplexer and separate decoder now used, and the elimination of the geography of the chip required to support a separate multiplexer and separate decoder, and without them a reduction in power dissipation is accomplished.

Finally, it is understood that the voltages, the voltage drop values and the resistance values set forth are to simplify the understanding of the invention and that these values will vary in practice as those skilled in the art understand.

What is claimed is:

1. An EFL latch merged with a decoder-multiplexer circuit comprised of:
    a plurality of current mode latching means, each of which includes a current switching means having first and second inputs and an output for passing a current from said first input to said output to indicate a high voltage state on said first input and for passing a current from said second input to said output to indicate a low voltage state on said first input; wherein the improvement comprises:
    a decoder-multiplexer means which includes a first plurality and a second plurality of respective gain elements with each plurality corresponding in number to said plurality of latching means;
    each gain element having a base, a collector, and an emitter with its base being coupled to anodes of a respective group of diodes;
    one of said diodes in each respective group which is coupled to a respective gain element of said first plurality having a cathode coupled to said current switching means in a respective one of said latching means to detect said voltage state therein, one of said diodes in each respective group which is coupled to a respective gain element of said second plurality having a cathode coupled to said current switching means in said respective one of said latching means to detect said voltage state therein; and cathodes of the remaining diodes being adapted to receive selection signals;
    the emitters of all of the gain elements of said first plurality being connected together and the emitters of all of the gain elements of the second plurality being connected together to form respective common outputs for multiplexing said voltage state from a selected one of said latching means in response to all of said selection signals on one group of said diodes being at a high logic level.

2. An EFL latch according to claim 1 wherein each of said current mode latching means further includes a voltage clamping means connected to said first input of said current switching means for clamping said voltage states when said selection signals on said diodes are at a low logic level.

3. An EFL latch according to claim 2 wherein said clamping means is a diode means.

4. An EFL latch according to claim 3 wherein said diode means is a Schottky diode.

5. An EFL latch according to claim 1 wherein said diodes in each of said respective groups are Schottky diodes.

6. An EFL latch according to claim 1 wherein each gain element of said plurality is a bipolar transistor.

7. An EFL latch according to claim 6 wherein each said transistor is an NPN transistor.

8. An EFL latch merged with a decoder-miltiplexer circuit comprised of:
    a plurality of latching means, each of which includes a diode means, a current source means, and first, second, third, fourth, and fifth gain elements having respective bases, collectors, and emitters;
    an emitter of said first gain element being connected to one emitter of said second gain element and to a collector of said fourth gain element to form a first current switch;
    said emitter of said third gain element being connected to another emitter of said second gain element and to a collector of said fifth gain element to form a second current switch;
    said emitters of said fourth and fifth gain elements being connected together and to said current source means to form a third current switch;
    said diode means having a cathode connected to the collector of said second gain element and the base of said third gain element;
    means for coupling a supply voltage to the collectors of said first and third gain elements and to an anode of said diode means; and
    a decoder-multiplexer means which includes a first plurality and a second plurality of respective gain elements with each plurality corresponding in number to said plurality of latching means;
    each gain element having a base, a collector, and an emitter with its base being coupled to a resistive means and to anodes of a respective group of diodes;
    means for coupling a supply voltage to every collector and resistive means in said decoder-multiplexer means;
    one of said diodes in each respective group which is coupled to a respective gain element of said first plurality having a cathode coupled to the collector of the second gain element in a respective one of said latching means, one of said diodes in each respective group which is coupled to a respective gain element of said second plurality having a cathode coupled to the collector of the second gain element in said respective one of said latching means, and cathodes of the remaining diodes being adapted to receive decode signals;
    the emitters of all of the gain elements of said first plurality being connected together and the emitters of all of the gain elements of said second plurality being coupled together to form respective common outputs for multiplexing a signal from a selected one of said latching means in response to all of said decode signals on one group of said diodes being in a high logic state.

* * * * *